(12) United States Patent
Luick

(10) Patent No.: US 7,024,618 B2
(45) Date of Patent: Apr. 4, 2006

(54) TRANSMISSION ERROR CHECKING IN RESULT FORWARDING

(75) Inventor: David Arnold Luick, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 532 days.

(21) Appl. No.: 10/061,854

(22) Filed: Feb. 1, 2002

(65) Prior Publication Data

US 2003/0149932 A1    Aug. 7, 2003

(51) Int. Cl.
*G06F 11/00*    (2006.01)

(52) U.S. Cl. .................. 714/800; 714/799; 708/531

(58) Field of Classification Search ............. 714/800, 714/799, 735; 340/146.2; 708/531
See application file for complete search history.

(56) References Cited

U.S. PATENT DOCUMENTS 5,155,735 A * 10/1992 Nash et al. ............... 714/800

* cited by examiner

*Primary Examiner*—Albert Decady
*Assistant Examiner*—Dipakkumar Gandhi
(74) *Attorney, Agent, or Firm*—Patterson & Sheridan LLP

(57) ABSTRACT

Disclosed is a parity checking scheme for data forwarding of results from a first function unit to a second function unit. In one embodiment, the results of the first function unit are forwarded along a result forwarding bus to a destination parity generator at the second function unit. The destination parity generator generates destination parity bits for the forwarded results and sends the destination parity bits to a parity checking circuit at the second function unit. In addition, the results of the first function unit are sent to a source parity generator at the first function unit. The source parity generator generates source parity bits for the forwarded results and sends the source parity bits to the parity checking circuit at the second function unit via a parity forwarding bus. The parity checking circuit compares the source parity bits and the destination parity bits, and generates a parity error signal indicating whether result forwarding is with any error.

24 Claims, 5 Drawing Sheets

TRANSMISSION ERROR CHECKING IN RESULT FORWARDING

BACKGROUND OF THE INVENTION

1. Field of the Invention

The present invention generally relates to transmission error checking, and more particularly to transmission error checking in result forwarding.

2. Description of the Related Art

CMOS processors of coming generations will have operating frequencies in a range of 5–10 GHz and very small device and wiring geometries on the order of 0.05 μm features. As a result, individual latches and dynamic logic nodes are susceptible to alpha and cosmic ray events. Further, signals are generated by dynamic logics and have pulse rise times of less than or equal to 10 ps along 0.05 μm spaced wires. As a result, transmission errors are likely to occur in the logics. These errors may grow at one order of magnitude per CMOS generation. Thus, transmission error checking is needed on the entire processor core data flow logic.

Parity checking is one of the transmission error checking methods in digital circuits. In computer terminology, parity checking refers to a technique of checking whether data has been lost or changed when it is transmitted from one place to another. An additional binary bit, the parity bit, is added to a group of bits that are transmitted together. This parity bit is used only for the purpose of identifying whether the bits being transmitted arrived successfully. Before the bits are sent, they are added together with no regard to carry (exclusive-OR operation) to generate a source parity bit (parity bit at source). As a result, if the source parity bit is a one, the number of ones among the bits is odd. If the source parity bit is a zero, the number of ones among the bits is even. At the receiving end, the bits being transmitted are again added together with no regard to carry to generate a destination parity bit (parity bit at destination). The destination parity bit is then compared with the source parity bit. If they are the same, it is assumed that the transmission is without error. If they are different, it is assumed that the transmission is with error.

In result forwarding, results of a current cycle at the outputs of a function unit (ALU, rotator, etc.) are forwarded immediately to the function unit's own inputs and to the inputs of other function units for use in a next cycle instead of being first bussed to a common register file and then read from the common register file to the inputs of the function units several cycles later. Most prior art function units do not have any transmission error checking scheme for the result forwarding. Some prior art transmission error checking schemes use full redundant function units or even entire redundant processor cores for error checking.

Accordingly, there is a need for an apparatus and method in which parity checking can be performed for data transmission in result forwarding, without redundant function units or processor cores.

SUMMARY OF THE INVENTION

In one embodiment, a digital system comprises a source function circuit and a destination function circuit coupled together via a forwarding bus. The source function circuit is configured to generate results, generate source parity bits for the results, send the results to the destination function circuit via the forwarding bus, and send the source parity bits to the destination function circuit via the forwarding bus after sending the results to the destination function circuit via the forwarding bus. The destination function circuit is configured to receive the results from the source function circuit via the forwarding bus, generate destination parity bits for the results, receive the source parity bits from the source function circuit via the forwarding bus, and compare the source parity bits and the destination parity bits to generate transmission error signals.

In another embodiment, a method for checking error of data transmission from a source function circuit to a destination function circuit via a forwarding bus is described. The method comprises (a) generating, with the source function circuit, results, (b) generating, with the source function circuit, source parity bits for the results, (c) sending the results to the destination function circuit via the forwarding bus, (d) sending the source parity bits to the destination function circuit via the forwarding bus after sending the results to the destination function circuit via the forwarding bus, (e) receiving, with the destination function circuit, the results from the source function circuit via the forwarding bus, (f) generating, with the destination function circuit, destination parity bits for the results, (g) receiving, with the destination function circuit, the source parity bits from the source function circuit via the forwarding bus, and (h) comparing, with the destination function circuit, the source parity bits and the destination parity bits to generate transmission error signals.

In yet another embodiment, a digital system comprises a source function circuit configured to generate results, generate source parity bits for the results, send the results to a destination function circuit via a forwarding bus, and send the source parity bits to the destination function circuit via the forwarding bus after sending the results to the destination function circuit via the forwarding bus.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

Embodiments are provided in which parity checking can be carried out for data forwarding of results of a first function unit to a second function unit. In one embodiment, the results of the first function unit are forwarded along a result forwarding bus to a destination parity generator at the second function unit. The destination parity generator generates destination parity bits for the forwarded results and sends the destination parity bits to a parity checking circuit at the second function unit. In addition, the results of the first function unit are sent to a source parity generator at the first function unit. The source parity generator generates source parity bits for the forwarded results and sends the source parity bits to the parity checking circuit at the second function unit via a parity forwarding bus. The parity checking circuit compares the source parity bits and the destination parity bits, and generates a parity error signal indicating whether result forwarding is with any error. With this arrangement, the source parity bits come to the parity checking circuit no later than the destination parity bits. Moreover, the parity checking scheme causes little or no delay to the forwarding of the results of the first function unit to the second function unit.

Figure 1:
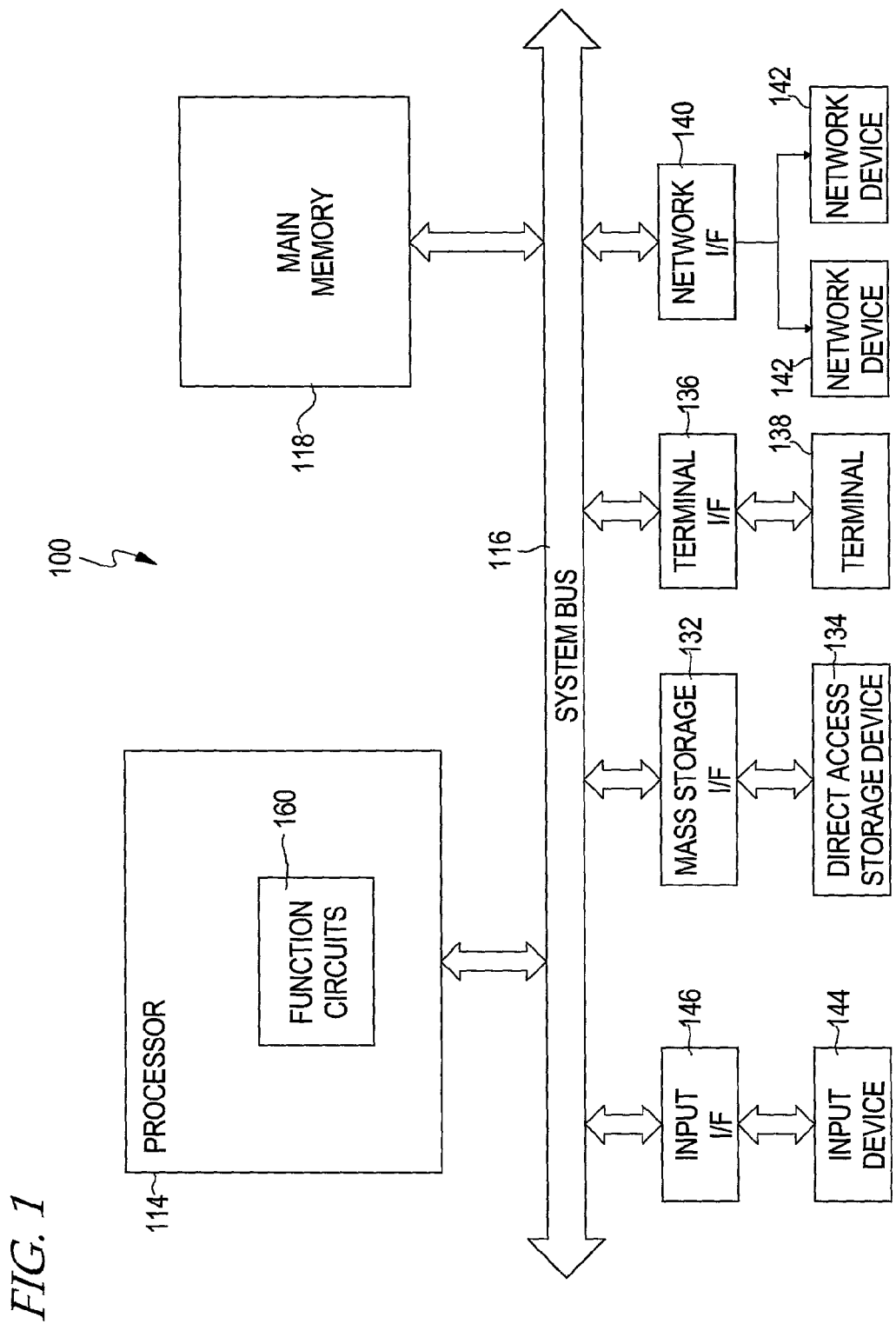
FIG. 1 shows a computer system 100 according to an embodiment.

FIG. 1 shows a computer system 100 according to an embodiment. Illustratively, the computer system 100 includes a system bus 116, at least one processor 114 coupled to the system bus 116. The processor 114 includes function circuits 160. The computer system 100 also includes an input device 144 coupled to system bus 116 via an input interface 146, a storage device 134 coupled to system bus 116 via a mass storage interface 132, a terminal 138 coupled to system bus 116 via a terminal interface 136, and a plurality of networked devices 142 coupled to system bus 116 via a network interface 140.

Terminal 138 is any display device such as a cathode ray tube (CRT) or a plasma screen. Terminal 138 and networked devices 142 may be desktop or PC-based computers, workstations, network terminals, or other networked computer systems. Input device 144 can be any device to give input to the computer system 100. For example, a keyboard, keypad, light pen, touch screen, button, mouse, track ball, or speech recognition unit could be used. Further, although shown separately from the input device, the terminal 138 and input device 144 could be combined. For example, a display screen with an integrated touch screen, a display with an integrated keyboard or a speech recognition unit combined with a text speech converter could be used.

Storage device 134 is DASD (Direct Access Storage Device), although it could be any other storage such as floppy disc drives or optical storage. Although storage 134 is shown as a single unit, it could be any combination of fixed and/or removable storage devices, such as fixed disc drives, floppy disc drives, tape drives, removable memory cards, or optical storage. Main memory 118 and storage device 134 could be part of one virtual address space spanning multiple primary and secondary storage devices.

The contents of main memory 118 can be loaded from and stored to the storage device 134 as processor 114 has a need for it. Main memory 118 is any memory device sufficiently large to hold the necessary programming and data structures of the invention. The main memory 118 could be one or a combination of memory devices, including random access memory (RAM), non-volatile or backup memory such as programmable or flash memory or read-only memory (ROM). The main memory 118 may be physically located in another part of the computer system 100. While main memory 118 is shown as a single entity, it should be understood that memory 118 may in fact comprise a plurality of modules, and that main memory 118 may exist at multiple levels, from high speed registers and caches to lower speed but larger DRAM chips.

Figure 2:
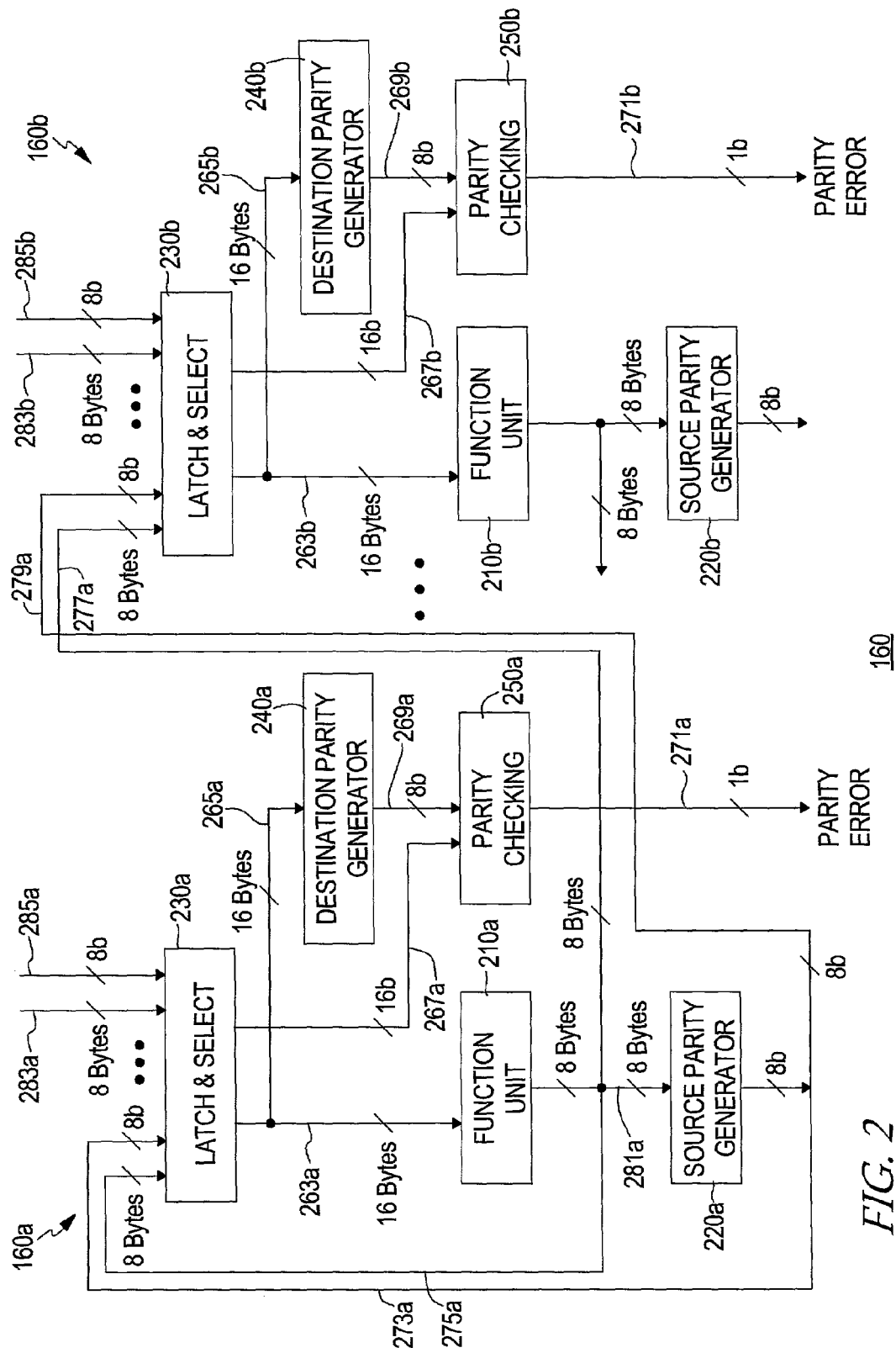
FIG. 2 shows one embodiment of the function circuits 160 of FIG. 1.

FIG. 2 shows one embodiment of the function circuits 160 of FIG. 1. The function circuits 160 include, illustratively, function circuits 160a and 160b. The function circuit 160a comprises a latch & select circuit 230a, a function unit 210a, a source parity generator 220a, a destination parity generator 240a, and a parity checking circuit 250a. The function circuit 160b comprises a latch & select circuit 230b, a function unit 210b, a source parity generator 220b, a destination parity generator 240b, and a parity checking circuit 250b. The latch & select circuits 230a & 230b serve as, among other things, input buffers of the function units 210a & 210b, respectively.

The function unit 210a receives as inputs operands from the latch & select circuit 230a via a connection line 263a. A connection line may comprise a plurality of physical wires. The function unit 210a operates on the operands and generates results to, illustratively, the latch & select circuits 230a & 230b via result forwarding buses 275a & 277a, respectively. In other words, the function unit 210a generates results to its own input buffer and to the input buffers of other function units. For simplicity, this is shown only for the function unit 210a. However, it is understood that the function unit 210b operates in a similar manner.

Assume the latch & select circuit 230b selects the results of the function unit 210a on the result forwarding bus 277a as an operand for the function unit 210b. The latch & select circuit 230b passes the results of the function unit 210a to the function unit 210b via connection line 263b. The latch & select circuit 230b also passes the results of the function unit 210a to the destination parity generator 240b via connection line 265b. The destination parity generator 240b operates on the results of the function unit 210a to generate destination parity bits for the results and sends the destination parity bits to the parity checking circuit 250b via connection line 269b.

Besides sending its results to the latch & select circuit 230b via the result forwarding bus 277a, the function unit 210a also sends the results to the source parity generator 220a via connection line 281a. The source parity generator 220a operates on the results of the function unit 210a to generate source parity bits for the results and sends the source parity bits to the latch & select circuit 230b via parity forwarding bus 279a. The latch & select circuit 230b selects and passes the source parity bits on parity forwarding bus 279a to the parity checking circuit 250b via connection line 267b. Besides the forwarding bus pair 277a,279a, the latch & select circuit 230b is coupled to other forwarding bus pairs for receiving results and corresponding source parity bits from other function units and its own corresponding function unit 210b. For instance, the forwarding bus pair 283b,285b may be used to pass results of the function unit 210b and the corresponding source parity bits generated by source parity generator 220b to the latch & select circuit 230b. In other words, a function unit has its own latch & select circuit to receive forwarded results from its own output and from the outputs of other function units. The function unit also has its own latch & select circuit to receive source parity bits from its own source parity generator and from source parity generators of other function units.

In FIG. 2, for simplicity, only the function circuits 160a and 160b are shown. There may be more or less than two function circuits in processor 114 (FIG. 1). Further, for simplicity, forwarding buses connecting the source parity generator 220b and the function unit 210b to the latch & select circuit 230a are not shown. Similarly, forwarding buses connecting the source parity generator 220b and function unit 210b to the latch & select circuit 230b are also not shown.

The parity checking circuit 250b operates on the source parity bits and destination parity bits to generate parity error signals. These parity error signals indicate whether the data transmission of the results from the function unit 210a through the result forwarding bus 277a to the latch & select circuit 230b (input buffer) of the function unit 210b is with any error.

The destination parity generator 240b is situated outside the transmission path of the results from the function unit 210a to the function unit 210b via the result forwarding bus 277a, the latch & select circuit 230b, and connection line 263b. As a result, the generation of the destination parity bits does not delay the transmission of the results from the function unit 210a to the function unit 210b via the result forwarding bus 277a, the latch & select circuit 230b, and connection line 263b.

The destination parity generator 240b and the source parity generator 220a are configured to generate the respective parity bits quickly and in about the same amount of time. A first propagation path for the destination parity bits goes from the outputs of the function unit 210a through result forwarding bus 277a, the latch & select circuit 230b, connection line 265b, and destination parity generator 240b to the parity checking circuit 250b. Whereas, a second propagation path for the source parity bits goes from the outputs of the function unit 210a through the source parity generator 220a, parity forwarding bus 279a, the latch & select circuit 230b, and connection line 267b to the parity checking circuit 250b. The forwarding buses 277a and 279a on the first and second propagation paths, respectively, are preferably substantially equivalent in terms of propagation delay. The latch & select circuit 230b is a common element of the first and second propagation paths. The connection lines 265b and 267b on the first and second propagation paths, respectively, are preferably substantially equivalent in terms of propagation delay. The destination parity generator 240b and the source parity generator 220a on the first and second propagation paths, respectively, are also equivalent in terms of propagation delay. As a result, the source and destination parity bits come to the parity checking circuit 250b relatively quickly and at about the same time.

Figure 3:
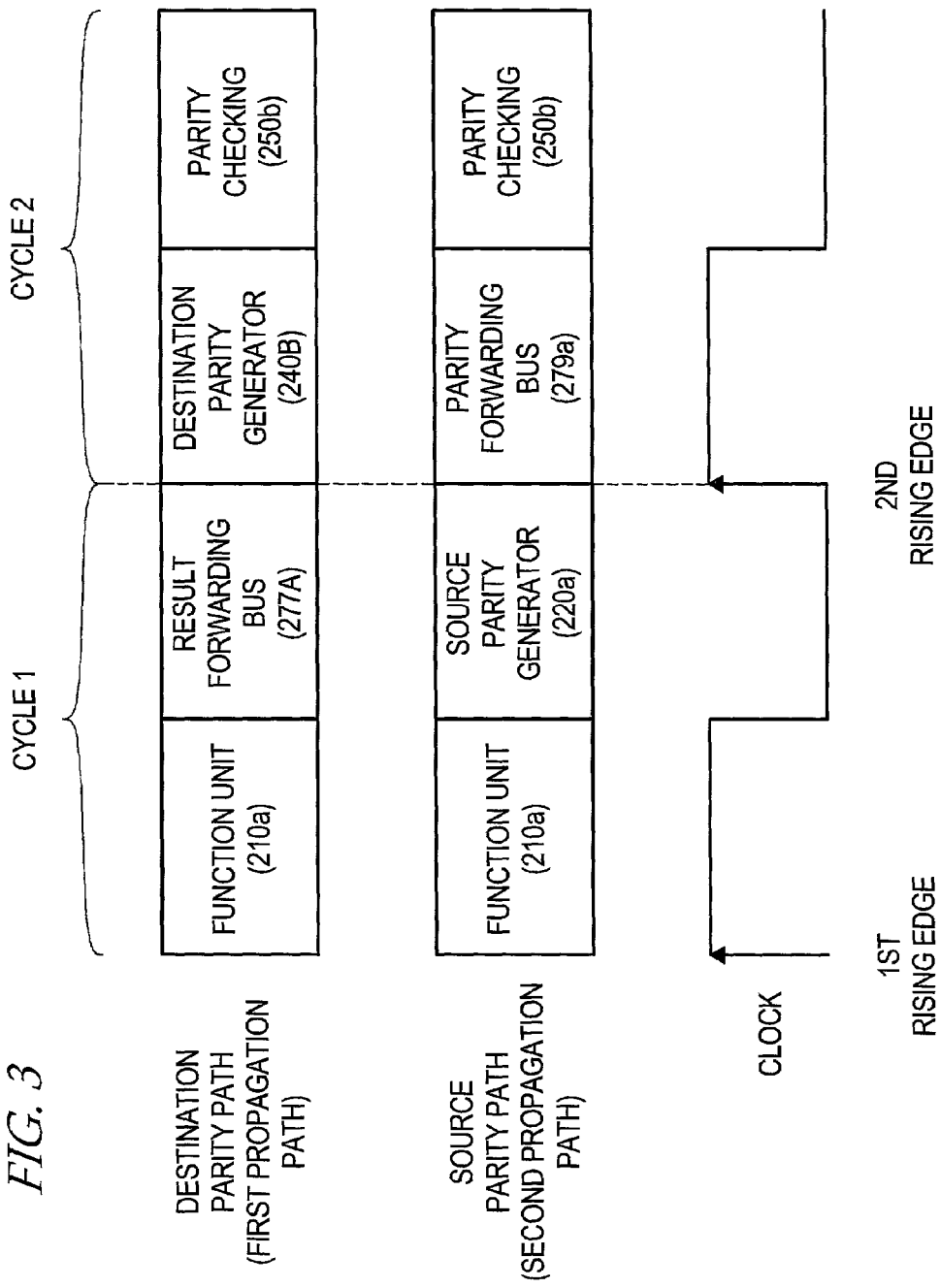
FIG. 3 shows a timing diagram for the first and second propagation paths in the function circuits 160 of FIG. 2 for the destination and source parity bits, respectively, over a period of two function unit cycles.

FIG. 3 shows a timing diagram for the first and second propagation paths in the function circuits 160 of FIG. 2 for the destination and source parity bits, respectively, over a period of two function unit cycles. For the first propagation path of the destination parity bits, propagation starts at the outputs of the function unit 210a, passes through the result forwarding bus 277a and destination parity generator 240b to the parity checking circuit 250b. At the second rising edge of the clock, the results of the function unit 210a have reached the latch & select circuit 230b after traveling along the result forwarding bus 277a.

For the second propagation path of the source parity bits, propagation starts at the outputs of the function unit 210a, passes through the source parity generator 220a and the parity forwarding bus 279a to parity checking circuit 250b. At the second rising edge of the clock, the source parity generator 220a has the source parity bits available at its outputs so that the source parity bits can be transmitted along the parity forwarding bus 279a to the latch & select circuit 230b during the next half cycle.

As a result, with reference also to FIG. 2, at the second rising edge of the clock, the results of the of the function unit 210a have reached the latch & select circuit 230b whereas the source parity bits of the results just start to be transmitted from the source parity generator to the parity forwarding bus. However, this does not delay the transmission of the results of the function unit 210a to the function unit 210a because the source parity bits of the results are not needed for this transmission.

Figure 4:
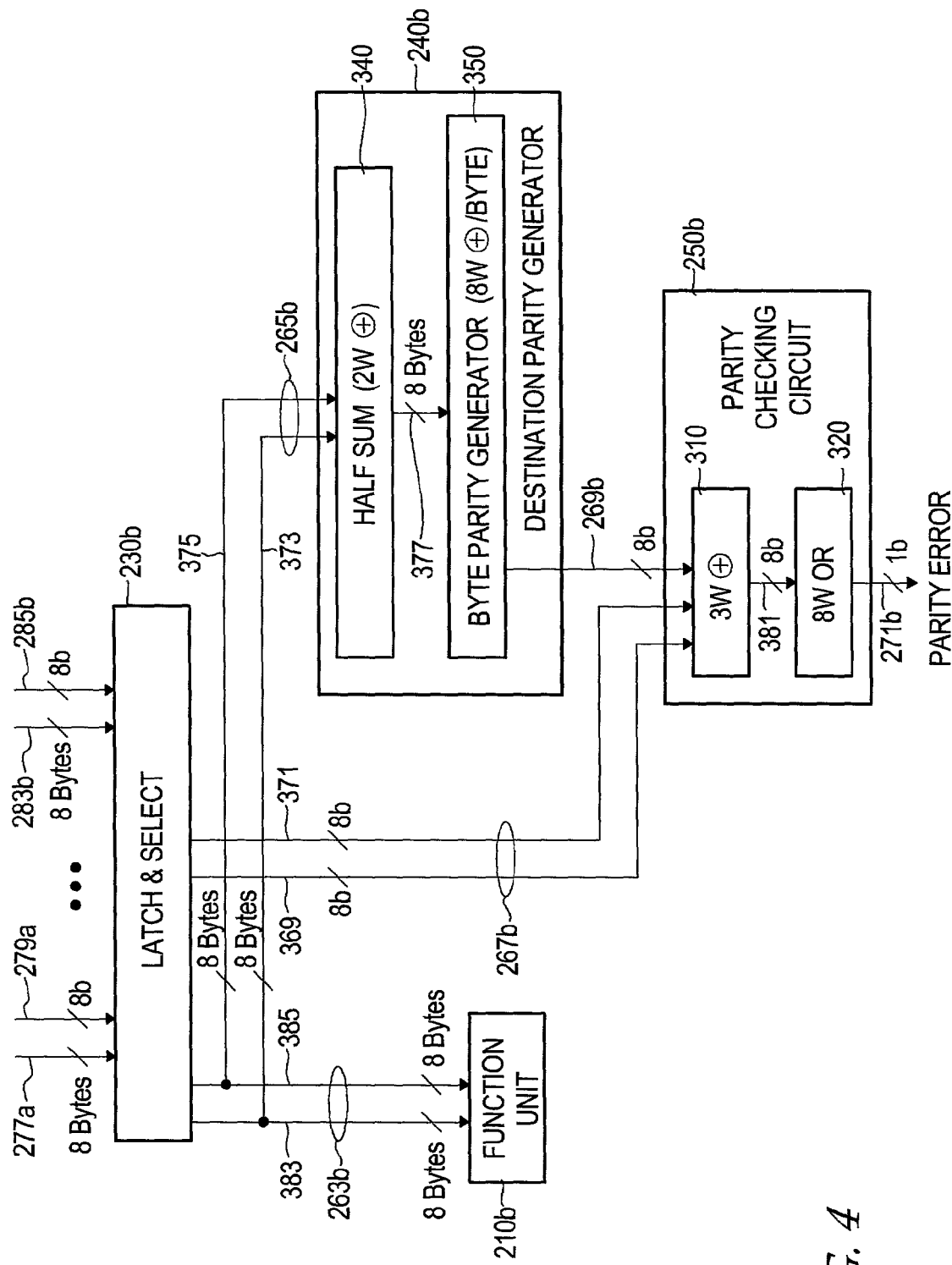
FIG. 4 shows one embodiment of the destination parity generator 240b and the parity checking circuit 250b of FIG. 2.

FIG. 4 shows one embodiment of the destination parity generator 240b and the parity checking circuit 250b of FIG. 2. For illustration, the latch & select circuit 230b selects and passes first and second 8-byte operands from result forwarding buses 277a & 283b, respectively, to function unit 210b via connection lines 383 & 385, respectively. The connection lines 383 & 385 form the connection is line 263b. The latch & select circuit 230b also passes the first and second operands on the result forwarding buses 277a & 283b to the destination parity generator 240b via connection lines 373 & 375, respectively. The connection lines 373 & 375 form the connection line 265b.

The destination parity generator 240b may include a half sum generator 340 and a byte parity generator 350. The destination parity generator 240b may be implemented in two And-Or-Inverter (AOI) logic levels. A first AOI logic level is used to implement the half sum generator 340. A second AOI logic level is used to implement the byte parity generator 350. The half sum generator 340 receives the first and second 8-byte operands from the latch & select circuit 230b via connection lines 373 & 375, respectively. The half sum generator 340 performs bitwise exclusive-OR operation on the first and second 8-byte operands to generate an 8-byte number and sends the 8-byte number to the byte parity generator 350 via connection line 377. For each byte (8 bits) of the 8-byte number on connection line 377, the byte parity generator 350 performs exclusive OR operation on the eight bits of the byte to generate one parity bit. As a result, the byte parity generator 350 generates eight destination parity bits for eight bytes of the number and sends the eight destination parity bits to the parity checking circuit 250b via connection line 269b.

The latch & select circuit 230b also selects and passes first and second source parity bits on the parity forwarding buses 279a & 285b to the parity checking circuit 250b via connection lines 369 & 371, respectively. The connection lines 369 & 371 form the connection line 267b.

The parity checking circuit 250b may include a three-way exclusive OR circuit 310 and an eight-way OR circuit 320. The three-way exclusive OR circuit 310 performs three-way, bitwise, exclusive OR operation on the eight destination parity bits on connection line 269b, the eight first source parity bits on connection line 369, and the eight second source parity bits on connection line 371 to generate eight parity error bits, one for each byte. The three-way exclusive OR circuit 310 sends the eight byte parity error bits to the eight-way OR circuit 320 via connection line 381. The eight-way OR circuit 320 performs eight-way OR operation on the eight byte parity error bits on connection line 381 to generate one-bit parity error signal indicating whether the transmission of the first and second operands from their sources to the latch & select circuit 230b is with any error. If the parity error signal is a one (HIGH), it is assumed an error has occurred. If the parity error signal is a zero (LOW), it is assumed no error has occurred.

In essence, by three-way, bitwise exclusive-ORing the eight first source parity bits, the eight second source parity bits, and the eight destination parity bits on connection lines 369, 371, and 269b, respectively, the parity checking circuit 250b compares parity bits generated at sending ends with parity bits generated at the receiving end. Two-way, bitwise exclusive-ORing the eight first source parity bits and the eight second source parity bits would yield eight source parity bits for the first and second operands. Then, two-way, bitwise exclusive-ORing the eight source parity bits and the eight destination parity bits would yield the eight byte parity error bits. Because bitwise exclusive-OR operations are cumulative, the two two-way, bitwise exclusive-OR operations are equivalent to the three-way, bitwise exclusive-OR operation performed by the three-way exclusive OR circuit 310. As a result, the parity checking circuit 250*b* compares the parity bits of the first and second operands generated at sending ends with the parity bits of the first and second operands generated at the receiving end. Moreover, if at least a byte parity error bit is a one, it is assumed that an error has occurred to the transmission of the corresponding byte of either the first or second operand. The 8-way OR circuit 320 ensures that the parity error signal is a one if any of the eight byte parity error bits is a one.

In one embodiment, with reference back to FIG. 2, the source parity generator 220*a* generates 16 source nibble-parity bits, instead of 8 source byte-parity bits as described above. In other words, for each of the 16 nibbles of the 8-byte results which the source parity generator 220*a* receives from the function unit 210*a* via connection line 281*a*, the source parity generator 220*a* generates a source nibble-parity bit to the result forwarding bus 279*a*. In this embodiment, the result forwarding bus 279*a* has 16 physical wires, instead of 8 physical wires described above, to transmit the 16 source nibble-parity bits. Generating a source nibble-parity bit is faster than generating a source byte-parity bit. As a result, this embodiment can be used where clock cycles need to be shortened. This can be the case where the result forwarding bus 277*a* and the parity forwarding bus 279*a* are short. This can be seen with respect to FIG. 3. If the time block of the result forwarding bus 277*a* on the destination parity path is shortened, the second rising edge of the clock can be moved to the left (i.e., clock cycles are shortened) only if the block of the source parity generator 220*a* on the source parity path is also shortened. The block of the source parity generator 220*a* on the source parity path can be shortened by generating, with the source parity generator 220*a*, 16 source nibble-parity bits instead of 8 source byte-parity bits. In this embodiment, with respect to FIG. 4, an additional circuit must be added on the path from the latch & select circuit 230*b* to the parity checking circuit 250*b* via connection line 267*b* to transform 32 source nibble-parity bits of the first and second 8-byte operands into 16 source byte-parity bits which are applied to the parity checking circuit 250*b*.

Figure 5:
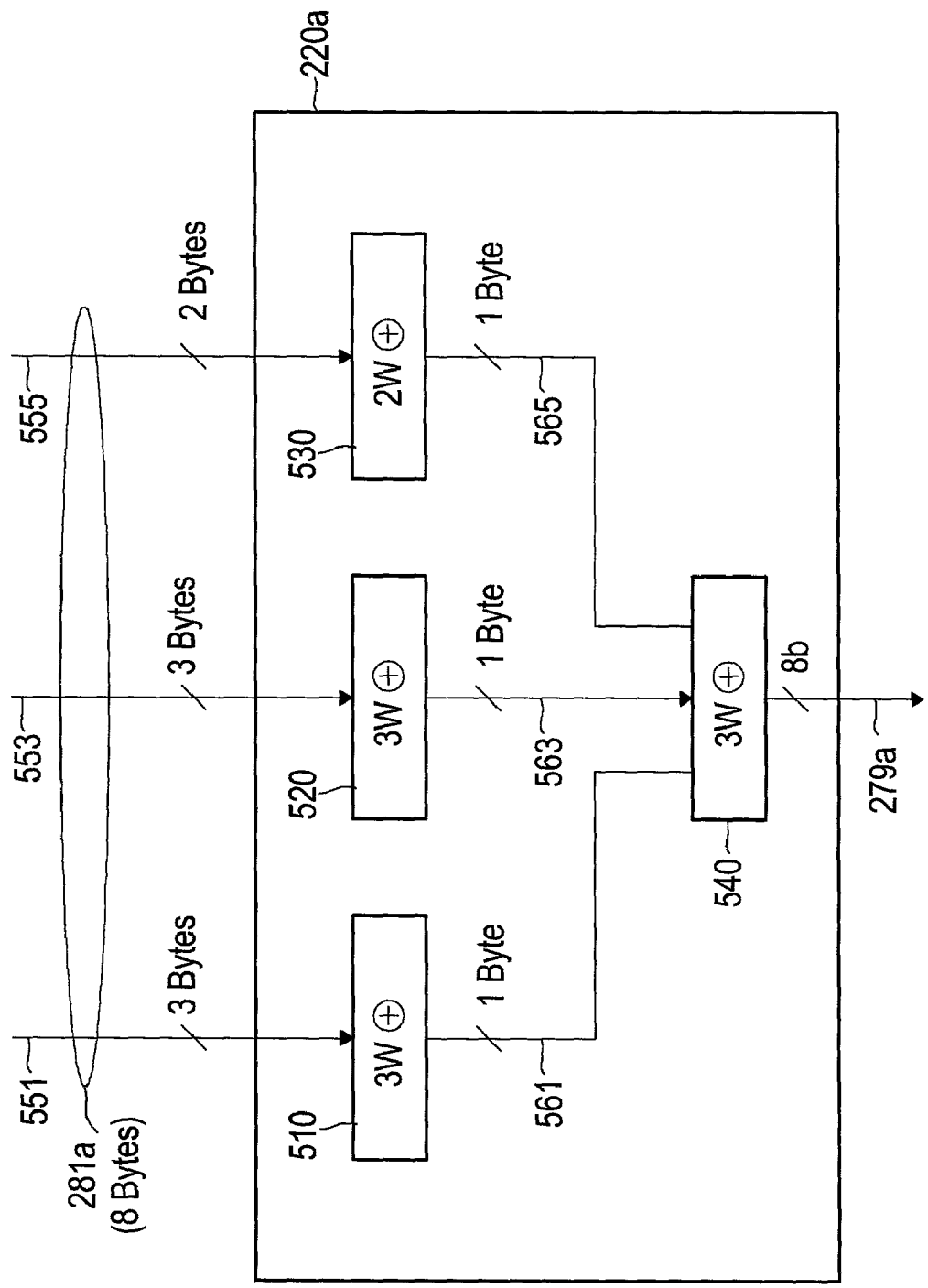
FIG. 5 shows one embodiment of the source parity generator 220a of FIG. 2.

FIG. 5 shows one embodiment of the source parity generator 220*a* of FIG. 2. The source parity generator 220*a* includes three 3-way exclusive-OR circuits 510, 520, and 540, and a 2-way exclusive-OR circuit 530. The 3-way exclusive-OR circuit 510, the 3-way exclusive-OR circuit 520, and the 2-way exclusive-OR circuit 530 are configured for receiving three bytes, three bytes, and two bytes from connection lines 551, 553, and 555, respectively. The connection lines 551, 553, and 555 form the connection line 281*a*. The 3-way exclusive OR circuit 510 performs a 3-way, bitwise, exclusive OR operation on the three bytes on connection line 551 and generates as outputs one byte to connection line 561. Similarly, the 3-way exclusive OR circuit 520 performs a 3-way, bitwise, exclusive OR operation on the three bytes on connection line 553 and generates as outputs one byte to connection line 563. Similarly, the 2-way exclusive OR circuit 530 performs a 2-way, bitwise, exclusive OR operation on the two bytes on connection line 555 and generates as outputs one byte to connection line 565. The 3-way exclusive-OR circuit 540 performs a 3-way, bitwise, exclusive OR operation on the three bytes generated by the 3-way exclusive OR circuit 510, the 3-way exclusive OR circuit 520, and the 2-way exclusive OR circuit 530 on the connection lines 561, 563, and 565, respectively, and generates one byte to the parity forwarding bus 279*a*. With reference back to FIG. 4, the byte then propagates along the parity forwarding bus 279*a* to the latch & select circuit 230*b* as the eight first source parity bits of the first operand. The latch & select circuit 230*b* selects and passes the eight first source parity bits and the eight second source parity bits on connection lines 279*a* & 285*b* to the parity checking circuit 250*b* via connection lines 369 & 371, respectively. The parity checking circuit 250*b* compares the eight first source parity bits and the eight second source parity bits with the eight destination parity bits by three-way, bitwise exclusive-ORing them and then generates the parity error signal.

While the foregoing is directed to embodiments of the present invention, other and further embodiments of the invention may be devised without departing from the basic scope thereof, and the scope thereof is determined by the claims that follow.

What is claimed is:

1. A processor, comprising:
   a source function circuit configured to:
      receive an operand as input,
      perform a first function on the received operand to generate results,
      generate source parity bits for the results,
      send the results to a destination function circuit via a first forwarding bus prior to or while generating the source parity bits for the results, and
      send the source parity bits to the destination function circuit via a second forwarding bus after sending the results to the destination function circuit via the first forwarding bus; and
   a destination function circuit configured to:
      receive the results from the source function circuit via the first forwarding bus,
      generate destination parity bits for the results,
      prior to or while generating the destination parity bits, receive the source parity bits from the source function circuit via the second forwarding bus,
      prior to or while the destination parity bits are being generated, perform a second function using the received results, and
      compare the source parity bits and the destination parity bits to generate transmission error signals.

2. The processor of claim 1, wherein the first forwarding bus comprises:
   a result forwarding bus for transmitting the results from the source function circuit to the destination function circuit; and
   the second forwarding bus comprises a parity forwarding bus for transmitting the source parity bits from the source function circuit to the destination function circuit.

3. The processor of claim 2, wherein the source function circuit comprises a source parity generator configured to receive the results as inputs and generate as outputs the source parity bits to the parity forwarding bus.

4. The processor of claim 3, wherein the destination function circuit comprises a latch end select circuit configured
   to receive a plurality of data inputs including the results and the source parity bits, from a plurality of function circuits including the source function circuit and the destination function circuit, and to select as input among the results and the source parity bits.

5. The processor of claim 4, wherein the destination function circuit further comprises a destination parity generator configured to receive as inputs fits results from the latch and select circuit and generate as outputs the destination parity bits.

6. The processor of claim 5, wherein the destination function circuit further comprises a parity checking circuit configured to receive the destination parity bits from the destination parity generator and the source parity bits from the latch and select circuit, compare the destination parity bits and the source parity bits, and generate as outputs the transmission error signals.

7. The processor of claim 6, wherein the source function circuit further comprises a first function unit selected from one of an arithmetic logic unit (ALU) and a rotator, the first function unit configured to generate the results to the result forwarding bus and to the source parity generator.

8. The processor of claim 7, wherein the destination function circuit further comprises a second function unit selected from one of an arithmetic logic unit (ALU) and a rotator, the second function unit configured to receive the results from the latch & select circuit.

9. The processor of claim 1, wherein the source function circuit comprises a source parity generator configured to receive the results as inputs and generate as outputs the source parity bits to the parity forwarding bus.

10. The processor of claim 9, wherein the destination function circuit comprises a latch & select circuit configured to:

receive a plurality of data inputs including the results and the source parity bits, from a plurality of function circuits including the source function circuit and the destination function circuit, and selected the results and the source parity bits.

11. A method for checking error of data transmission in a processor, the method comprising the following steps:

generating results, with a source function circuit of the processor, by performing a first function on an operand received by the source function circuit;

generating, with the source function circuit, source parity bits for the results while receiving, with a destination function circuit of the processor, the results from the source function circuit via a first forwarding bus;

sending the source parity bits to the destination function circuit via a second forwarding bus after sending the results to the destination function circuit via the first forwarding bus;

generating, with the destination function circuit, destination parity bits for the results while receiving, with the destination function circuit, the source parity bits from the source function circuit via the second forwarding bus;

prior to or while the destination parity bits are being generated, performing a second function at the destination function circuit using the received results; and comparing, with the destination function circuit, the source parity bits and the destination parity bits.

12. The method of claim 11, wherein:

the first forwarding bus comprises a result forwarding bus and the second forwarding bus comprises a parity forwarding bus.

13. The method of claim 12, wherein the step of generating, with the source function circuit, source parity bits for the results comprises:

using a source parity generator to receive the results as inputs; and generating, with the source parity generator, the source parity bits to the parity forwarding bus.

14. The method of claim 13, wherein the steps of receiving, with the destination function circuit, the results and the source parity bits, respectively, from the source function circuit via the forwarding bus comprise;

using a latch & select circuit to receive a plurality of date inputs including the results and the source parity bits, from a plurality of function circuits including the source function circuit and the destination function circuit; and selecting, with the latch & select circuit, the results and the source parity bits, respectively.

15. The method of claim 14, wherein the step of generating, with the destination function circuit, destination parity bits for the results comprises:

using a destination parity generator to receive as inputs the results from the latch & select circuit; and generating, with the destination parity generator, the destination parity bits.

16. The method of claim 15, wherein the step of comparing, comprises:

receiving, with a parity checking circuit, the destination parity bits from the destination parity generator and the source parity bits from the latch & select circuit;

comparing the destination parity bits and the source parity bits with the parity checking circuit; and generating the transmission error signals with the parity checking circuit.

17. The method of claim 16, wherein the step of generating the results with the source function circuit comprises generating, with a first function unit comprising one of an arithmetic logic unit and a rotator, the results to the result forwarding bus and to the source parity generator.

18. The method of claim 17, further comprises performing a second function using a second function unit in the destination function circuit to the results from the latch & select circuit.

19. The method of claim 11, wherein the step of generating, with the source function circuit, source parity bits for the results comprises:

using a source parity generator to receive the results as inputs; and generating, with the source parity generator, the source parity bits to the forwarding bus.

20. The method of claim 19, wherein the steps of receiving, with the destination function circuit, the results and the source parity bits, respectively, from the source function circuit via the forwarding bus comprise:

using a latch & select circuit to receive a plurality of data inputs including the results and the source parity bits, from a plurality of function circuits including the source function circuit and the destination function circuit; and selecting, with the latch & select circuit, the results and the source parity bits, respectively.

21. A processor having a plurality of function circuits, each comprising:

an input circuit for receiving an input;

a function unit to perform a function on a resolved input to generate results;

a source parity generator configured to generate source parity bits for the results while the results are sent to the input circuit of another function circuit via a first forwarding bus and to send the source parity bits to the input circuit of the other function circuit via a second forwarding bus with an immediately subsequent clock signal change after sending the results to the input circuit of the other function circuit via the first forwarding bus.

22. The processor of claim 21, wherein:

the first forwarding bus comprises a result forwarding bus for transmitting the results; and the second forwarding bus comprises a parity forwarding bus for transmitting the source parity bits.

23. The processor of claim 22, wherein a second one of the function circuits comprises a destination parity generator configured to receive results from a first one of the function circuits as inputs and generate as outputs destination parity bits in an immediately subsequent clock signal change after the source parity generator of the first function circuit generates the source parity bits.

24. The processor of claim 23, wherein a first propagation path from the function unit of the first function circuit through the source parity generator to a parity checking circuit of the second function circuit is substantially the same as a second propagation path from the function unit of the first function circuit through the destination parity generator of the second function circuit to the parity checking circuit of the second function circuit.

* * * * *